United States Patent [19] [11] Patent Number: 4,554,513
So [45] Date of Patent: Nov. 19, 1985

[54] REPLICA CIRCUIT

[75] Inventor: Eddy So, Gloucester, Canada

[73] Assignee: Canadian Patents and Development Limited-Société Canadienne des Brevets et D'Exploitation Limteé, Ottawa, Canada

[21] Appl. No.: 661,610

[22] Filed: Oct. 17, 1984

[51] Int. Cl.⁴ .............................................. H03F 1/34
[52] U.S. Cl. ...................................... 330/85; 330/293
[58] Field of Search ................... 330/75, 85, 293, 291, 330/310, 311

[56] References Cited

U.S. PATENT DOCUMENTS 4,360,784 11/1982 Bartlett .................................. 330/75

Primary Examiner—James B. Mullins
Assistant Examiner—G. Wan

[57] ABSTRACT

A circuit is provided for obtaining an accurate replica of an active electrical parameter, i.e. a voltage or a current. The circuit is an improvement over prior circuits in respect of accuracy, both in relation to magnitude and phase. When providing a voltage replica, the principal utility is to provide a scaled-down replica of a high voltage that can be used for accurate measurements of power. In its applicability to current, the principal utiity is to provide an accurate scaled-up current reference source, preferably in quadrature to the input voltage, for use in calibration of reactive volt-ampere or volt-ampere-hour meters. The objective of improved accuracy is achieved by combining known scaling-up and scaling down circuits with a current comparator.

14 Claims, 4 Drawing Figures

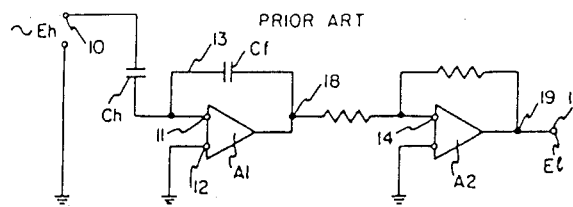
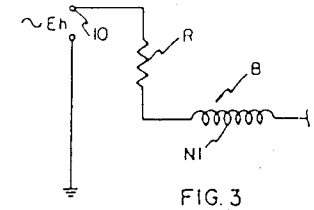
FIG. 1    FIG. 3
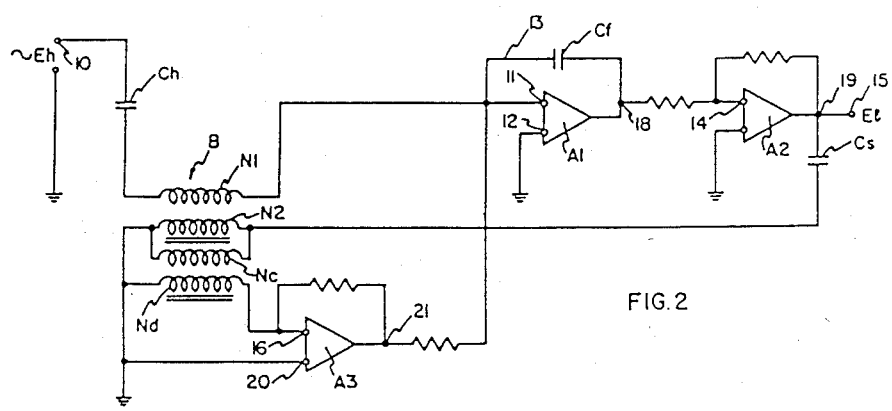
FIG. 2
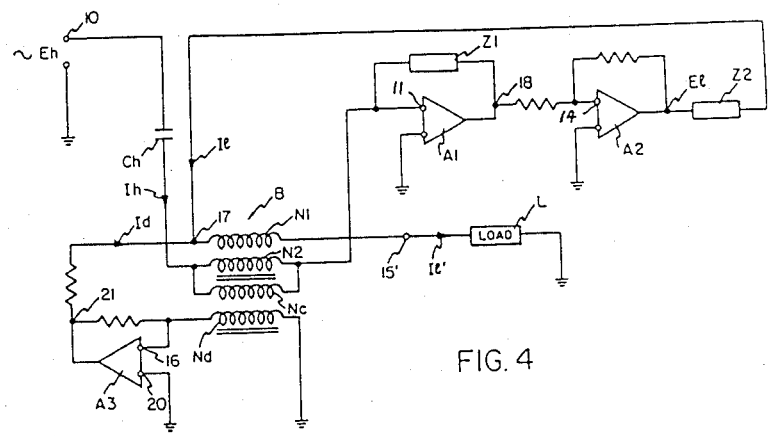
FIG. 4

REPLICA CIRCUIT

BACKGROUND TO THE INVENTION

The invention relates to a circuit for obtaining an accurate replica of an active electrical parameter, i.e. a voltage or a current. The replica is required to be accurate both in respect of magnitude and phase.

In its application to providing a voltage replica, the principal utility of the present invention is to provide an accurate, scaled-down replica of a high voltage. Since such voltage will be used in the precise measurement of power, the phase must also be accurately maintained, or at least the relative phase angle between the input and output must be accurately known.

In its application to providing a current replica, the principal utility of the present invention is to provide an accurate, scaled-up current reference source, preferably in quadrature to the input voltage, for use in the calibration of reactive volt-ampere or volt-ampere-hour meters.

The principal objective of the present invention is to provide increased accuracy over circuits previously available for these purposes.

BRIEF DESCRIPTION OF THE DRAWINGS

In the drawings:

FIG. 1 is a prior art circuit;

FIG. 2 shows an improvement to the circuit of FIG. 1 incorporating a first embodiment of the invention for generating a voltage replica;

FIG. 3 is a fragment of FIG. 2 showing a modification thereof; and

FIG. 4 is a circuit according to a second embodiment of the invention for generating a current replica.

DESCRIPTION OF THE PRIOR ART CIRCUIT

FIG. 1 shows an active, capacitive divider for an alternating, high voltage Eh, the purpose being to scale this voltage down to an acceptable metering level. The voltage Eh is applied from an input terminal 10 to one terminal of a stable, low-loss, high-voltage, compressed-gas-dielectric capacitor Ch, the other terminal of which is connected to an active input 11 of a main amplifier A1 having a ground input 12, an output 18 and a solid-dielectric capacitor Cf in a feedback loop 13. The output of the amplifier A1 is fed to an active input 14 of a unity gain, inverting amplifier A2 having an output 19 that provides a voltage El at an output terminal 15, where $$El = \frac{Ch}{Cf} Eh$$

and the output voltage El is of the same polarity as the input voltage Eh.

The stability and phase accuracy of such a voltage divider are mostly determined by changes in the magnitude of the capacitances due to temperature changes, and the dissipation component of the capacitor Cf. These variations can be of the order, respectively, of 100 to 1000 parts per million per degree Celcius and 100 to 10,000 parts per million.

When measuring power at unity power factor, accurate knowledge of the voltage and current magnitude is essential, but considerable latitude in the phase angle between these two quantities is permissible (14142 μrad or 48.6 min. being equivalent to 0.01 percent). The phase angle tolerance decreases, however, with decreasing power factor (becoming 100 μrad or 0.3438 min. for 0.01 percent at zero power factor), while a corresponding relaxation takes place in the magnitude requirements.

The true expression for the output voltage El is $$El = \frac{Ch}{Cf} Eh(1 + \alpha + j\beta)$$

where
α is the magnitude error, and
β is the phase error.

SUMMARY OF THE INVENTION

The present invention achieves its objective of improved accuracy by combining the prior art circuit of FIG. 1 with a known current comparator.

DETAILED DESCRIPTION OF THE EMBODIMENTS OF THE INVENTION

In FIG. 2 the current in the high-voltage capacitor Ch passes through a ratio winding N1 of a current comparator B that also has a second ratio winding N2, a compensation winding Nc and a detection winding Nd. The output voltage El is connected to ground through a series connection of a low-loss, gas-dielectric capacitor Cs and the winding N2, where $$\frac{Cs}{Cf} = \frac{N1}{N2}$$

(N1 and N2 here representing the number of turns in such windings). Due to the magnitude and phase errors of the output voltage El, the current comparator B will not be in balance and a difference current will be induced in the detection winding Nd. This difference current is added through the feedback amplifier A3 to the current in the feedback capacitor Cf, resulting in a highly accurate, stable output voltage El with virtually zero phase error.

The current comparator is known per se. See, for example, "The Compensated Current Comparator; A New Reference Standard for Current—Transformer Calibrations in Industry" by N. L. Kusters et al. IEEE Transactions on Instrumentation and Measurement, Volume IM-13, Numbers 2 and 3, June–September 1964 pages 107–114, which publication also explains the function of the compensation winding Nc. Application of such a current comparator to high voltage capacitance measurement in a bridge is also described in "A Transformer-Ratio-Arm Bridge for High-Voltage Capacitance Measurements" by N. L. Kusters et al. Communication and Electronics published by The Institute of Electrical and Electronics Engineers, Inc. November 1976. See also U.S. Pat. No. 4,296,369 issued Oct. 20, 1981 to W. J. M. Moore et al. (Canadian Pat. No. 1,143,442 issued Mar. 22, 1983). Finally, reference is made to "Direct Reading Non-Frequency-Sensitive Current Comparator Bridges for Capacitance and Inductive Reactance Measurements at High Voltage" by A. H. Foley 1983 IEEE pages 434–438. FIG. 3 of this Foley publication expands on FIG. 1 of the present application. As FIG. 3 of Foley makes clear his adjustment is manual, rather than automatic as in the present invention.

FIG. 3 shows a modification of the circuit of FIG. 2 wherein the capacitor Ch has been replaced by a high precision resistor R. The remainder of the circuit is unchanged. The output voltage El now lags 90° behind the input voltage Eh, but in other respects is the same. Hence the impedance connected to the input terminal 10 can be either a capacitor or a resistor. Theoretically, an inductor could be used and would produce an output El 180° out of phase with respect to the input voltage Eh. However, in practice, no loss-less inductor exists, and hence this input impedance will normally be either a capacitor or a resistor.

It is also possible to replace the feedback capacitor Cf with a resistor, provided that at the same time the capacitor Cs is similarly replaced by a resistor with a very small phase angle error. In this case, in the FIG. 2 arrangement with Ch as the input, the output El will be 90° leading with respect to Eh. With the FIG. 3 modification to this arrangement, i.e. with capacitors Ch, Cf and Cs all replaced by resistors, the output voltage El will be in phase with the input voltage Eh.

Whereas the primary purpose behind the circuit of FIG. 2 is to obtain a reduced replica of the high voltage input Eh for accurate measurement of the latter, the main use for the circuit of FIG. 3 will be to generate a pure inductive current that will be used by connecting the output El to a load or bridge circuit through a resistor with a very small phase angle error, to provide, for example, a reference inductive current for testing reactors to determine their losses.

In the circuit of FIG. 4 the same current comparator B has its ratio winding N2 connected between the capacitor Ch and the first amplifier A1 which now has an impedance Z1 in its feedback loop. The current output Il of the second amplifier A2 is connected through an impedance Z2 to the ratio winding N1 at point 17, along with the output Id from the feedback amplifier A3 which receives the current from the detection winding Nd as before. The impedances Z1 and Z2 will be of the same type; i.e. both resistors or both capacitors, and will be selected to satisfy the equation:

$$\frac{Z1}{Z2} = \frac{N2}{N1}$$

The amplifier A2 is still a unity gain, inverting amplifier, being provided so that the final output current Il' in a load L connected to an output terminal 15' will be of the same polarity as the input current Ih in the capacitor Ch.

As in FIG. 2, the current comparator B will not be in balance and a difference current will flow in the detection winding Nd. After amplification in the amplifier A3, this difference current Id is added at junction point 17 to the output current Il' from the amplifier A2 to form the final output current Il which provides a stable, accurate, quadrature current reference, where $$Il' = \frac{N2}{N1} Ih \text{ or}$$

$$Il' = j\frac{N2}{N1} Eh\omega Ch$$

Thus the current Ih in the capacitor Ch has effectively been multiplied by N2/N1. For example, if Ih were 10 mA and N2/N1 were 100, then Il' will be 1A.

In the calibration of reactive volt-ampere and volt-ampere-hour meters and in precision bridges it is necessary to have a reference source that can provide a current that is in quadrature with the applied voltage. For high voltage applications this can be accomplished by using an essentially loss-less and stable, high-voltage, compressed-gas-dielectric capacitor as a voltage-to-current converter to provide a capacitive quadrature current reference for a bridge circuit. However, the high voltage withstand capability and the physical constraints limit the capacitance value of such a capacitor to 1000 pF or less. Such capacitors are usually designed to have a product of voltage and capacitance of about $26 \times 10^3$ kV.pF, thus providing a maximum quadrature current of about 10 mA at power frequencies. Thus, for example, a 1000 or 100 pF capacitor would have a maximum voltage rating of about 26 or 260 kV respectively. This constraint has, in practice, limited the maximum current levels to about 10 mA. The present arrangement, by employing a current comparator, provides a means for extending the maximum current level up to 1A with the same high voltage withstand capability. This means that the product of voltage and capacitance has effectively been increased by two orders of magnitude, i.e. to $26 \times 10^5$ kV.pF.

The modification of FIG. 3 can be applied to the circuit of FIG. 4, i.e. the capacitor Ch replaced by a resistor R. Again, the function of the circuit is basically unchanged, except that the output current is now in-phase with the input voltage Eh.

The performance of the basic circuits of FIGS. 2 to 4 can be summarised by the following table.

|  | FIG. 2 | FIG. 2 modified by FIG. 3 | FIG. 4 | FIG. 4 modified by FIG. 3 |
|---|---|---|---|---|
| Input voltage Eh |  |  |  |  |
| magnitude | 1 | 1 | 1 | 1 |
| phase | 0° | 0° | 0° | 0° |
| Output voltage El |  |  |  |  |
| magnitude | $\frac{Ch}{Cf}$ | $\frac{1}{R\omega Cf}$ | — | — |
| phase | 0° | 90° lagging | — | — |
| Input current Ih |  |  |  |  |
| magnitude | — | — | 1 | 1 |
| phase | — | — | 90° leading | 0° |
| Output current Il' |  |  |  |  |
| magnitude | — | — | $\frac{N2}{N1}$ | $\frac{N2}{N1}$ |
| phase | — | — | 90° leading (or in phase relative to the input current Ih) | 0° (or in phase relative to the input current Ih) |

Thus, in each case, the combination of a current comparator with a divider circuit has provided an accurate replica of the input voltage or current and a controlled phase relationship. In the FIG. 2 circuit the voltage replica will be scaled down from the input; in the FIG. 4 circuit the current replica will be scaled up from the input.

In any one of the foregoing embodiments, i.e. FIG. 2; FIG. 2 modified by FIG. 3; FIG. 4 or FIG. 4 modified by FIG. 3, together with the alternatives provided by substitution of resistors for the capacitors Cf and Cs, the inverting amplifier A2 can be omitted, provided that the current comparator windings are so connected that the ampere-turn balance is maintained. In this case, the output voltage El will be taken from the point 18 (output of amplifier A1) so that the capacitor Cs (or its substitute resistor R) or the impedance Z2 will be connected to the point 18. The result will be an output El or Il' of opposite polarity to that obtained when the inverting amplifier A2 is used.

Yet another modification to FIGS. 2 or 3 is to connect the output of the feedback amplifier A3 (depending on its polarity) through a resistor to the input 14 of the inverting amplifier A2, instead of to the input 11 of the main amplifier A1. In this modification, the polarity of the output signal El would be unchanged from that obtained by the connection of FIGS. 2 or 3. In FIG. 4, the output of the feedback amplifier A3 (depending on its polarity) could be connected through a resistor to the input 11 of amplifier A1 or the input 14 of the inverting amplifier A2. The polarity of the output current Il' would be unchanged from that obtained by the connection of FIG. 4.

FURTHER SUMMARY OF THE INVENTION

Hence the invention can be defined generically as a circuit for generating a replica of an active alternating electrical parameter, comprising (a) an input terminal (10) for receiving an alternating high voltage input (Eh);

(b) a first impedance (Ch or R) having one terminal connected to said input terminal;

(c) an output terminal (15 or 15') for delivering a replica of said high voltage input (Eh) or of a current (Ih) generated in said first impedance by said high voltage input;

(d) a current comparator (B) having a pair of input windings (N1, N2) and a detection winding (Nd);

(e) a main amplifier (A1) having a ground input (12), an active input (11), an output (18) and a feedback loop (13) between its output and active input including a second impedance (Cf or Z1), said active input (11) being connected to the other terminal of the first impedance through a first one (N1 or N2) of said input windings;

(f) a third impedance (Cs or Z2) having one terminal connected to said output terminal and to receive the output of the main amplifier (A1) and its other terminal connected to ground through the second input winding (N2 or N1); and (g) a feedback amplifier (A3) having a ground input (20), an active input (16) and an output (21), such active input of the feedback amplifier being connected to ground through the detection winding (Nd), and the output of the feedback amplifier being connected to modify the current in one of said input windings (N2 or N1) to return the current in said detection winding (Nd) to zero.

Preferably there is also an inverting amplifier (A2) with an input (14) connected to the output (18) of the main amplifier (A1) and an output (19) connected to the output terminal to supply thereto an inverted equivalent of the output (18) of the main amplifier (A1).

In its voltage application (FIG. 2), the output (21) of the feedback amplifier (A3) is connected to the active input (11) of the main amplifier (A1) or to the active input (14) of the inverting amplifier (A2), and the output terminal (15) is directly connected to the output of the inverting amplifier (A2).

In its current application (FIG. 4), the output (21) of the feedback amplifier (A3) is connected to the junction point (17) which is located on the side of the input winding (N1) that is connected to the third impedance (Z2), while the output terminal (15') is connected to the other side of such input winding (N1).

I claim:

1. A circuit for generating a replica of an active alternating electrical parameter, comprising (a) an input terminal for receiving an alternating high voltage input;

(b) a first impedance having one terminal connected to said input terminal;

(c) an output terminal for delivering a replica of said high voltage input or of a current generated in said first impedance by said high voltage input;

(d) a current comparator having a pair of input windings and a detection winding;

(e) a main amplifier having a ground input, an active input, an output and a feedback loop between its output and active input including a second impedance, said active input being connected to the other terminal of the first impedance through a first one of said input windings;

(f) a third impedance having one terminal connected to said output terminal and to receive the output of the main amplifier and its other terminal connected to ground through the second input winding; and (g) a feedback amplifier having a ground input, an active input and an output, such active input of the feedback amplifier being connected to ground through the detection winding, and the output of the feedback amplifier being connected to modify the current in one of said input windings to return the current in said detection winding to zero.

2. A circuit according to claim 1, including (h) an inverting amplifier having an input connected to the output of the main amplifier and an output connected to said output terminal to supply thereto an inverted equivalent of the output of the main amplifier.

3. A circuit for generating a scaled-down replica of an alternating voltage, comprising (a) an input terminal for receiving an alternating high voltage input;

(b) a first impedance having one terminal connected to said input terminal;

(c) an output terminal for delivering a replica of said high voltage input;

(d) a current comparator having a pair of input windings and a detection winding;

(e) a main amplifier having a ground input, an active input, an output and a feedback loop between its output and active input including a second impedance, said active input being connected to the other terminal of the first impedance through a first one of said input windings;

(f) a third impedance having one terminal connected to said output terminal and to receive the output of the main amplifier and its other terminal connected to ground through the second input winding; and (g) a feedback amplifier having a ground input, an active input and an output, such active input of the feedback amplifier being connected to ground through the detection winding, and the output of the feedback amplifier being connected to the active input of the main amplifier whereby to modify the current in said second input winding to return the current in said detection winding to zero.

4. A circuit for generating a scaled-down replica of an alternating voltage, comprising (a) an input terminal for receiving an alternating high voltage input;

(b) a first impedance having one terminal connected to said input terminal;

(c) an output terminal for delivering a replica of said high voltage input;

(d) a current comparator having a pair of input windings and a detection winding;

(e) a main amplifier having a ground input, an active input, an output and a feedback loop between its output and active input including a second impedance, said active input being connected to the other terminal of the first impedance through a first one of said input windings;

(f) an inverting amplifier having an input connected to the output of the main amplifier and an output connected to said output terminal to supply thereto an inverted equivalent of the output of the main amplifier;

(g) a third impedance having one terminal connected to said output terminal and its other terminal connected to ground through the second input winding; and (h) a feedback amplifier having a ground input, an active input and an output, such active input of the feedback amplifier being connected to ground through the detection winding, and the output of the feedback amplifier being connected to the active input of one of the main and inverting amplifiers whereby to modify the current in said second input winding to return the current in said detection winding to zero.

5. A circuit according to claim 4, wherein
(i) said first, second and third impedances are capacitors;
(j) the ratio between the turns in said first and second input windings is equal to the capacitance ratio between said third and second impedances; and
(k) said replica voltage is in-phase with said input voltage and their ratio is equal to the capacitance ratio of said first and second impedances.

6. A circuit according to claim 4, wherein
(i) said first impedance is a resistor and said second and third impedances are capacitors;
(j) the ratio between the turns in said first and second input windings is equal to the capacitance ratio between said third and second impedances; and
(k) said replica voltage has a phase 90° lagging said input voltage and their ratio is equal to the impedance ratio of said second and first impedances.

7. A circuit for generating a scaled-up replica of an alternating current, comprising
(a) an input terminal for receiving an alternating high voltage input;
(b) a first impedance having one terminal connected to said input terminal;
(c) an output terminal for delivering a replica of a current generated in said first impedance by said high voltage input;
(d) a current comparator having a pair of input windings and a detection winding;
(e) a main amplifier having a ground input, an active input, an output and a feedback loop between its output and active input including a second impedance, said active input being connected to the other terminal of the first impedance through a first one of said input windings;
(f) a third impedance having one terminal connected to receive the output of said main amplifier and its other terminal connected to the output terminal through the second input winding; and
(g) a feedback amplifier having a ground input, an active input and an output, such active input of the feedback amplifier being connected to ground through the detection winding, and the output of the feedback amplifier being connected to said output terminal through said second input winding whereby to modify the current in said second input winding to return the current in said detection winding to zero.

8. A circuit according to claim 7, wherein the output of the feedback amplifier is indirectly connected to said output terminal by being connected to the input of said main amplifier.

9. A circuit according to claim 7, including
(h) an inverting amplifier having an input connected to the output of the main amplifier and an output connected to said one terminal of the third impedance to supply thereto an inverted equivalent of the output of the main amplifier.

10. A circuit according to claim 9, wherein the output of the feedback amplifier is indirectly connected to said output terminal by being connected to the input of said inverting amplifier.

11. A circuit according to claim 7, wherein
(i) said first impedance is a capacitor;
(j) the ratio between the turns in said first and second input windings is equal to the impedance ratio between said second and third impedances; and
(k) the ratio between said replica current and the current generated in said first impedance by the high voltage input is equal to the ratio between the turns in said first and second input windings.

12. A circuit according to claim 9, wherein
(i) said first impedance is a capacitor;
(j) the ratio between the turns in said first and second input windings is equal to the impedance ratio between said second and third impedances; and
(k) said replica current is in-phase with the current generated in said first impedance by the high voltage input and the ratio between such currents is equal to the ratio between the turns in said first and second input windings.

13. A circuit according to claim 7, wherein
(i) said first impedance is a resistor;
(j) the ratio between the turns in said first and second input windings is equal to the impedance ratio between said second and third impedances; and
(k) the ratio between said replica current and the current generated in said first impedance by the high voltage input is equal to the ratio between the turns in said first and second input windings.

14. A circuit according to claim 9, wherein
(i) said first impedance is a resistor;
(j) the ratio between the turns in said first and second input windings is equal to the impedance ratio between said second and third impedances; and
(k) said replica current is in-phase with the current generated in said first impedance by the high voltage input and the ratio of such currents is equal to the ratio between the turns in said first and second input windings.

* * * * *